United States Patent
Ko et al.

(10) Patent No.: US 10,038,132 B2
(45) Date of Patent: Jul. 31, 2018

(54) THERMOELECTRIC MATERIALS AND THEIR MANUFACTURING METHOD

(71) Applicant: LG CHEM, LTD., Seoul (KR)

(72) Inventors: Kyung-Moon Ko, Daejeon (KR); Tae-Hoon Kim, Daejeon (KR); Cheol-Hee Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 138 days.

(21) Appl. No.: 14/914,617

(22) PCT Filed: Oct. 16, 2014

(86) PCT No.: PCT/KR2014/009749
§ 371 (c)(1),
(2) Date: Feb. 25, 2016

(87) PCT Pub. No.: WO2015/057000
PCT Pub. Date: Apr. 23, 2015

(65) Prior Publication Data
US 2016/0225971 A1    Aug. 4, 2016

(30) Foreign Application Priority Data

Oct. 17, 2013 (KR) .......... 10-2013-0124024
Sep. 30, 2014 (KR) .......... 10-2014-0131791

(51) Int. Cl.
| | | |
|---|---|---|
| C09K 11/88 | (2006.01) | |
| H01L 35/14 | (2006.01) | |
| H01L 35/16 | (2006.01) | |
| C01B 19/00 | (2006.01) | |

(52) U.S. Cl.
CPC ............ *H01L 35/16* (2013.01); *C01B 19/007* (2013.01); *H01L 35/14* (2013.01); *C01P 2002/54* (2013.01); *C01P 2002/72* (2013.01); *C01P 2006/32* (2013.01); *C01P 2006/40* (2013.01)

(58) Field of Classification Search
CPC ....... C09K 11/881; H01L 35/16; H01L 35/14; H01L 31/0272; C01B 19/007; C01B 19/00

USPC .................. 252/62.3 T, 519.14
See application file for complete search history.

(56) References Cited

U.S. PATENT DOCUMENTS

| | | | | |
|---|---|---|---|---|
| 3,095,330 | A | * | 6/1963 | Epstein .............. H01L 35/16 136/201 |
| 2003/0057512 | A1 | | 3/2003 | Sterzel et al. |
| 2010/0051080 | A1 | | 3/2010 | Rhyee et al. |
| 2010/0307556 | A1 | | 12/2010 | Yoon et al. |
| 2013/0009115 | A1 | | 1/2013 | Park et al. |
| 2013/0234375 | A1 | | 9/2013 | Ren et al. |

FOREIGN PATENT DOCUMENTS

| | | | |
|---|---|---|---|
| CN | 102674270 A | | 9/2012 |
| CN | 102674842 A | | 9/2012 |
| CN | 103872237 A | * | 6/2014 |
| EP | 1 930 960 A1 | | 6/2008 |
| GB | 1346783 A | | 2/1974 |

OTHER PUBLICATIONS

Machine translation of CN103872237A, printed Sep. 3, 2017, 11 pages.*
Xiao Jingjing, "Preparation and Thermoelectric Properties of Cu_2Se Based Compounds", Sep. 15, 2011, Chinese Master's Theses Full-text Database, 18 pages.*
International Search Report for PCT/KR2014/009749 filed on Oct. 16, 2014.
Yunxiang Hu et al., "Deposition of copper selenide thin films and nanoparticles", Journal of Crystal Growth, 2006, pp. 61-65, vol. 297, Elsevier B.V.
Xiao Jingjing, "Preparation and Thermoelectric Properties of Cu₂Se Based Compounds", Chinse Master's Theses Full-text Database, Sep. 15, 2011, pp. 40-48.
Extended European Search Report for Application No. 14854841.5, dated Jan. 24, 2017.

* cited by examiner

*Primary Examiner* — Matthew E Hoban
*Assistant Examiner* — Lynne Edmondson

(57) ABSTRACT

Disclosed is a thermoelectric material with excellent thermoelectric performance. The thermoelectric material is expressed by Chemical Formula 1 below:

$$Cu_xSe_{1-y}Q_y \qquad \text{<Chemical Formula 1>}$$

where Q is at least one element selected from the group consisting of S and Te, $2<x\leq2.6$ and $0<y<1$.

10 Claims, 7 Drawing Sheets

THERMOELECTRIC MATERIALS AND THEIR MANUFACTURING METHOD

TECHNICAL FIELD

The present disclosure relates to thermoelectric conversion technology, and more particularly, to a thermoelectric conversion material with excellent thermoelectric conversion properties, its manufacturing method and its use.

The present application is a National Stage of International Patent Application No. PCT/KR2014/009749, filed on Oct. 16, 2014, which claims priority to Korean Patent Application No. 10-2013-0124024 filed on Oct. 17, 2013 and Korean Patent Application No. 10-2014-0131791 filed on Sep. 30, 2014 in the Republic of Korea, the disclosures of which are incorporated herein by reference.

BACKGROUND ART

A compound semiconductor is a compound that is composed of at least two types of elements rather than one type of element such as silicon or germanium and operates as a semiconductor. Various types of compound semiconductors have been developed and are currently being used in various fields of industry. Typically, a compound semiconductor may be used in thermoelectric conversion elements using the Peltier Effect, light emitting devices using the photoelectric conversion effect, for example, light emitting diodes or laser diodes, fuel cells, and the like.

Particularly, a thermoelectric conversion element is used for thermoelectric conversion power generation or thermoelectric conversion cooling applications, and generally includes an N-type thermoelectric semiconductor and a P-type thermoelectric semiconductor electrically connected in series and thermally connected in parallel. The thermoelectric conversion power generation is a method which generates power by converting thermal energy to electrical energy using a thermoelectromotive force generated by creating a temperature difference in a thermoelectric conversion element. Also, the thermoelectric conversion cooling is a method which produces cooling by converting electrical energy to thermal energy using an effect that a temperature difference creates between both ends of a thermoelectric conversion element when a direct current flows through the both ends of the thermoelectric conversion element.

The energy conversion efficiency of the thermoelectric conversion element generally depends on a performance index value or ZT of a thermoelectric conversion material. Here, the ZT may be determined based on the Seebeck coefficient, electrical conductivity, and thermal conductivity, and as a ZT value increases, a thermoelectric conversion material has better performance.

Heretofore, many kinds of thermoelectric conversion materials have been proposed, but there is substantially no thermoelectric conversion material with sufficiently high thermoelectric conversion performance. In particular, thermoelectric conversion materials are applied to more and more fields, and temperature conditions may vary depending on their applied fields. However, since thermoelectric conversion materials may have different thermoelectric conversion performance depending on temperature, each thermoelectric conversion material needs to have optimized thermoelectric conversion performance suitable for its applied field. However, there is not yet proposed a thermoelectric conversion material with optimized performance for various and broad temperature ranges.

DISCLOSURE

Technical Problem

Accordingly, the present disclosure is designed to solve the above problem, and therefore, the present disclosure is directed to providing a thermoelectric material having excellent thermoelectric conversion performance over a broad temperature range, its manufacturing method and its use.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

After repeated studies on the thermoelectric material, the inventors of the present disclosure have successfully synthesized the thermoelectric material expressed by Chemical Formula 1 and found that the thermoelectric conversion material can have excellent thermoelectric conversion performance.

$Cu_xSe_{1-y}Q_y$ <Chemical Formula 1>

In Chemical Formula 1, Q is at least one element selected from the group consisting of S and Te, $2<x\leq2.6$ and $0<y<1$.

In Chemical Formula 1, x may satisfy a condition of $x\leq2.2$.

In Chemical Formula 1, x may satisfy a condition of $x\leq2.1$.

In Chemical Formula 1, x may satisfy a condition of $2.025\leq x$.

In Chemical Formula 1, y may satisfy a condition of $y<0.1$.

In Chemical Formula 1, y may satisfy a condition of $y\leq0.05$.

In another aspect, the present disclosure also provides a method for manufacturing a thermoelectric material, which includes forming a mixture by weighing and mixing Cu, Se and Q according to Chemical Formula 1; and thermally treating the mixture to synthesize a compound expressed by Chemical Formula 1.

Here, the method for manufacturing a thermoelectric material according to the present disclosure may further include sintering the compound under pressure after the compound forming step is performed.

In addition, the pressure sintering step may be performed by means of hot pressing or spark plasma sintering.

Also, to achieve the above object, a thermoelectric conversion element according to the present disclosure includes the thermoelectric material according to the present disclosure.

Also, to achieve the above object, a thermoelectric power generator according to the present disclosure includes the thermoelectric material according to the present disclosure.

Advantageous Effects

According to the present disclosure, a thermoelectric material having excellent thermoelectric conversion performance may be provided.

Particularly, the thermoelectric material according to one aspect of the present disclosure may have low thermal diffusivity, low lattice thermal conductivity, high Seebeck coefficient and high ZT value at a wide medium-low temperature range of 50° C. to 500° C.

Accordingly, the thermoelectric material according to the present disclosure may replace a traditional thermoelectric material, or may be used as another material in conjunction with a traditional thermoelectric material.

Further, the thermoelectric material according to the present disclosure may maintain a high ZT value at temperature below 500° C., further at low temperature of about 200° C., in comparison to existing thermoelectric materials. Therefore, when used in a thermoelectric device for power generation, the thermoelectric material according to the present disclosure may ensure stable thermoelectric conversion performance even if the material is exposed to a comparatively low temperature.

Also, the thermoelectric material according to the present disclosure may be used in a solar cell, an infrared (IR) window, an IR sensor, a magnetic device, a memory, and the like.

DESCRIPTION OF DRAWINGS

The accompanying drawings illustrate a preferred embodiment of the present disclosure and together with the foregoing disclosure, serve to provide further understanding of the technical spirit of the present disclosure, and thus, the present disclosure is not construed as being limited to the drawing.

BEST MODE

Figure 1:
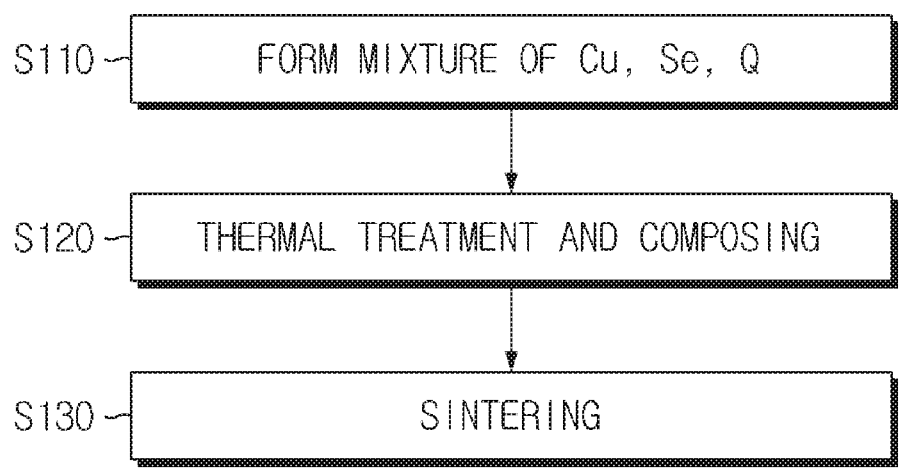
FIG. 1 is a schematic flowchart for illustrating a method for manufacturing a compound semiconductor according to an embodiment of the present disclosure.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the spirit and scope of the disclosure.

A thermoelectric material according to an embodiment of the present disclosure may be expressed by Chemical Formula 1 below.

$$Cu_xSe_{1-y}Q_y \qquad \text{<Chemical Formula 1>}$$

In Chemical Formula 1, Q is at least one element selected from the group consisting of S and Te, $2 < x \le 2.6$ and $0 < y < 1$.

First, the thermoelectric material according to the present disclosure is configured so that Se is partially replaced with Cu and/or Se. In other words, in the thermoelectric material according to the present disclosure, some Se sites may be deficient in a Cu—Se-based thermoelectric material, and such deficient sites may be replaced with S and/or Te. In addition, due to the above composition characteristic, the thermoelectric material according to the present disclosure may have further improved thermoelectric conversion performance in comparison to traditional Cu—Se-based thermoelectric materials.

In addition, the thermoelectric material according to the present disclosure is a Cu—Se-based thermoelectric material including Cu and Se, in which X is greater than 2.

Preferably, Chemical Formula 1 may satisfy a condition of $x \le 2.2$. In particular, Chemical Formula 1 may satisfy a condition of $x < 2.2$.

More preferably, in Chemical Formula 1, the thermoelectric material of the present disclosure may satisfy a condition of $x \le 2.15$.

In particular, Chemical Formula 1 may satisfy a condition of $x \le 2.1$.

In addition, Chemical Formula 1 may satisfy a condition of $2.01 \le x$. In particular, in Chemical Formula 1, x may satisfy a condition of $2.01 < x$.

Further, in Chemical Formula 1, x may satisfy a condition of $2.025 \le x$. In this condition, the thermoelectric material according to the present disclosure may have more improved thermoelectric conversion performance.

In particular, in Chemical Formula 1, x may satisfy a condition of $2.04 < x$.

Further, in Chemical Formula 1, x may satisfy a condition of $2.05 \le x$.

In addition, in Chemical Formula 1, x may satisfy a condition of $2.075 \le x$.

In addition, Chemical Formula 1 may satisfy a condition of $y < 0.1$. In particular, Chemical Formula 1 may satisfy a condition of $y \le 0.075$. Further, Chemical Formula 1 may satisfy a condition of $y \le 0.05$.

In this instance, a second phase may be partially included in the thermoelectric material represented by Chemical Formula 1, and its amount may change based on a thermal treatment condition.

As described above, the thermoelectric material according to the present disclosure may be provided so that, assuming that the content of Se is 1 in a Cu—Se-based thermoelectric material, the content of Cu is greater than 2 and Se is partially replaced with S and/or Te. Therefore, due to the above composition characteristic, the thermoelectric material according to the present disclosure may have an increased Seebeck coefficient, lowered thermal diffusivity, increased ZT value and thus improved thermoelectric conversion performance in comparison to traditional Cu—Se-based thermoelectric materials.

FIG. 1 is a schematic flowchart for illustrating a method for manufacturing a thermoelectric material according to an embodiment of the present disclosure.

Referring to FIG. 1, a method for manufacturing a thermoelectric material according to the present disclosure may include a mixture forming step S110 and a compound forming step S120.

In the mixture forming step S110, S and/or Te may be mixed as raw material in addition to Cu and Se according to Chemical Formula 1 to form a mixture.

Here, in the step S110, the raw materials may be mixed in a powder state. In this case, raw materials may be mixed better, and reactivity among the raw materials may be improved, which results in good synthesizing in the step S120.

In addition, in the mixture forming step S110, raw materials may be mixed by means of hand milling using a mortar, ball milling, planetary ball mill, and the like, but the present disclosure is not limited to these specific mixing methods.

In the compound forming step S120, the mixture formed in the step S110 is thermally treated to form a compound according to Chemical Formula 1, namely $Cu_xSe_{1-y}Q_y$ (Q is at least one of S and Te, $2<x\leq2.6$, $0<y<1$). Here, in the step S120, the mixture generated in the step S110 may be put into a furnace and heated at a predetermined temperature for a predetermined time so that the compound of Chemical Formula 1 may be formed.

Preferably, the step S120 may be performed by a solid state reaction (SSR) method. When the synthesis is performed by the solid state reaction method, the raw material used in the synthesis, that is, the mixture may cause reaction in a solid state without changing to a perfect liquid state during the synthesis.

For example, the step S120 may be performed in the temperature range of 200° C. to 650° C. for 1 to 24 hours. Because this temperature range is lower than a melting point of Cu, when the heating is performed in the temperature range, the $Cu_xSe_{1-y}Q_y$ compound may be formed in which Cu does not melt. For example, the step S120 may be performed under the temperature condition of 450° C. for 15 hours.

In the step S120, in order to form $Cu_xSe_{1-y}Q_y$, the mixture of Cu and Se as well as S and/or Te may be put into a hard mold and formed into pellets, and the mixture in a pellet form may be put into a fused silica tube and vacuum-sealed. Also, the vacuum-sealed first mixture may be put into the furnace and thermally treated.

Preferably, as shown in FIG. 1, the method for manufacturing a thermoelectric material according to the present disclosure may further include sintering the compound under pressure S130 after the compound forming step S120 is performed.

Here, the step S130 may be performed by means of hot pressing (HP) or spark plasma sintering (SPS). The thermoelectric material according to the present disclosure may easily have a high sintering density and a thermoelectric performance improvement effect, when sintered by means of pressure sintering.

For example, the pressure sintering step may be performed under the pressure condition of 30 MPa to 200 MPa. Also, the pressure sintering step may be performed under the temperature condition of 300° C. to 800° C. Also, the pressure sintering step may be performed under the pressure and temperature conditions for 1 minute to 12 hours.

Also, the step S130 may be performed in a vacuum state or in a state where gas such as Ar, He, $N_2$, and the like containing some or no hydrogen is flowing.

Also preferably, in the step S130, the compound formed in the step S120 may be ground into powder, and then pressure sintering may be performed. In this case, the sintering and measuring step may be more conveniently performed, and the sintering density may further increase.

A thermoelectric conversion element according to the present disclosure may include the above thermoelectric material. Particularly, the thermoelectric material according to the present disclosure may effectively improve a ZT value in a broad temperature range, in comparison to traditional thermoelectric materials, particularly Cu—Se-based thermoelectric materials. Thus, the thermoelectric material according to the present disclosure may be used instead of traditional thermoelectric conversion materials or further used in a thermoelectric conversion element in conjunction with traditional thermoelectric conversion materials.

A thermoelectric conversion element according to the present disclosure may include the above thermoelectric material. Particularly, the thermoelectric material according to the present disclosure may effectively improve a ZT value in a broad temperature range, in comparison to traditional thermoelectric materials, particularly Cu—Se-based thermoelectric materials. Thus, the thermoelectric material according to the present disclosure may be used instead of traditional thermoelectric conversion materials or further used in a thermoelectric conversion element in conjunction with traditional thermoelectric conversion materials.

Further, the thermoelectric material according to the present disclosure may be used in a thermoelectric power generator designed for thermoelectric power generation using a waste heat source or the like. That is, the thermoelectric power generator according to the present disclosure includes the above thermoelectric material described above. The thermoelectric material according to the present disclosure exhibits a high ZT value in a broad temperature range, for example in a temperature range of 50° C. to 500° C., and thus may be more useful for thermoelectric power generation.

Also, the thermoelectric material according to the present disclosure may be manufactured as a bulk-type thermoelectric material.

Hereinafter, the present disclosure will be described in detail through examples and comparative examples. The examples of the present disclosure, however, may take several other forms, and the scope of the present disclosure should not be construed as being limited to the following examples. The examples of the present disclosure are provided to more fully explain the present disclosure to those having ordinary knowledge in the art to which the present disclosure pertains.

Example 1

Cu, Se and S in a powder form were weight to conform to the chemical formula of $Cu_{2.025}Se_{0.99}S_{0.01}$, and then put into an alumina mortar, followed by mixing. The mixed materials were put into a hard mold, formed into pellets, put into a fused silica tube, and vacuum-sealed. In addition, the resultant product was put into a box furnace to rise temperature to 500° C. and then heated for 15 hours, and after heating, was slowly cooled down to room temperature to obtain a $Cu_{2.025}Se_{0.99}S_{0.01}$ compound.

In addition, the compound was filled into a graphite mold, and spark plasma sintering (SPS) was performed thereto for 10 minutes in the condition of 500° C. and 50 MPa in a vacuum state to obtain a sample of Example 1. At this time, a sintering density was set to be 98% or above in comparison to a theoretical value.

Example 2

Cu, Se and S in a powder form were weight to conform to the chemical formula of $Cu_{2.025}Se_{0.95}S_{0.05}$, and then mixed and composed in the same way as Example 1 to obtain a $Cu_{2.025}Se_{0.95}S_{0.05}$ compound. In addition, the compound was sintered in the same way as Example 1 to obtain a sample of Example 2.

Example 3

Cu, Se and S in a powder form were weight to conform to the chemical formula of $Cu_{2.05}Se_{0.99}S_{0.01}$, and then mixed and composed in the same way as Example 1 to obtain a $Cu_{2.05}Se_{0.99}S_{0.01}$ compound. In addition, the compound was sintered in the same way as Example 1 to obtain a sample of Example 3.

Example 4

Cu, Se and S in a powder form were weight to conform to the chemical formula of $Cu_{2.05}Se_{0.95}S_{0.05}$, and then mixed and composed in the same way as Example 1 to obtain a $Cu_{2.05}Se_{0.95}S_{0.05}$ compound. In addition, the compound was sintered in the same way as Example 1 to obtain a sample of Example 4.

Example 5

Cu, Se and S in a powder form were weight to conform to the chemical formula of $Cu_{2.1}Se_{0.99}S_{0.01}$, and then mixed and composed in the same way as Example 1 to obtain a $Cu_{2.1}Se_{0.99}S_{0.01}$ compound. In addition, the compound was sintered in the same way as Example 1 to obtain a sample of Example 5.

Example 6

Cu, Se and S in a powder form were weight to conform to the chemical formula of $Cu_{2.1}Se_{0.95}S_{0.05}$, and then mixed and composed in the same way as Example 1 to obtain a $Cu_{2.1}Se_{0.95}S_{0.05}$ compound. In addition, the compound was sintered in the same way as Example 1 to obtain a sample of Example 6.

Comparative Example

Cu and Se in a powder form were weight to conform to the chemical formula of $Cu_2Se$, and then mixed and composed in the same way as Example 1 to obtain a $Cu_2Se$ compound. In addition, the compound was sintered in the same way as Example 1 to obtain a sample of the comparative example.

Figure 2:
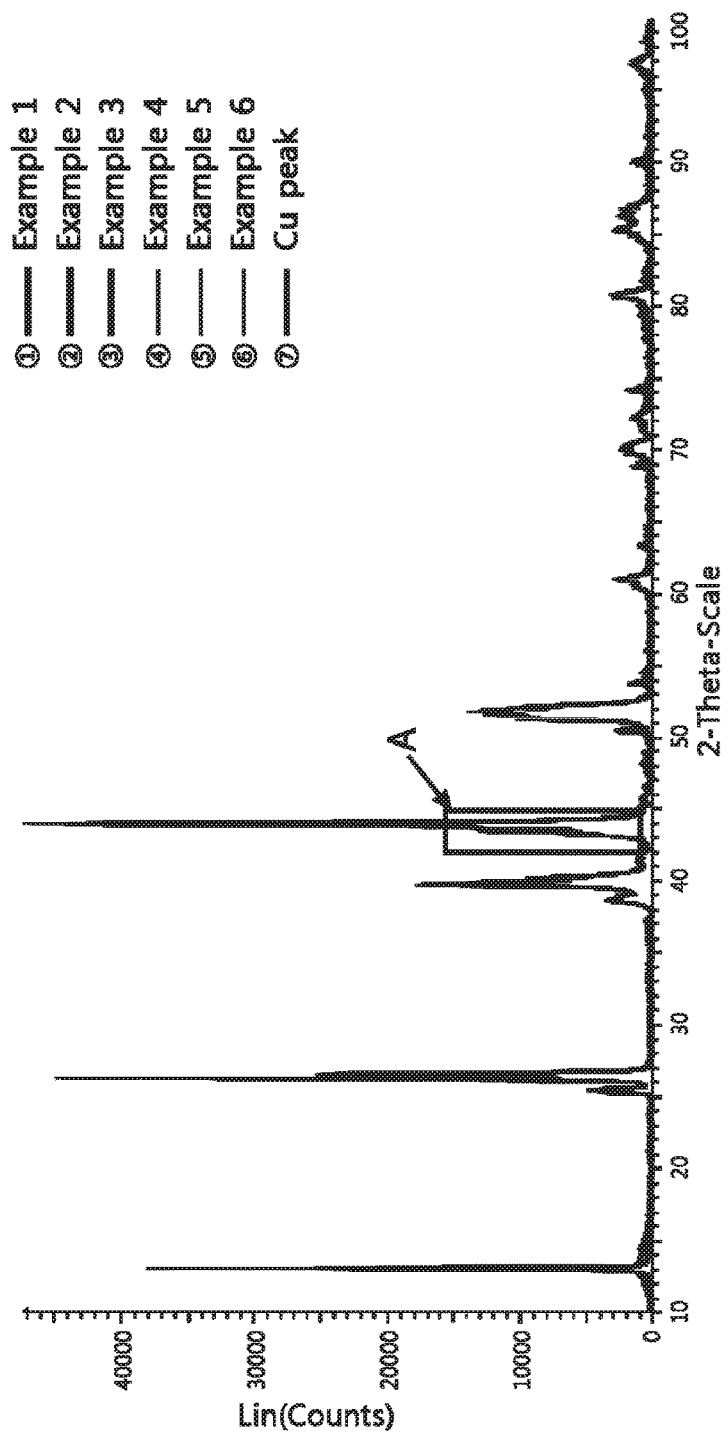
FIG. 2 is a graph showing XRD analysis results for thermoelectric materials according to several embodiments of the present disclosure.
Figure 3:
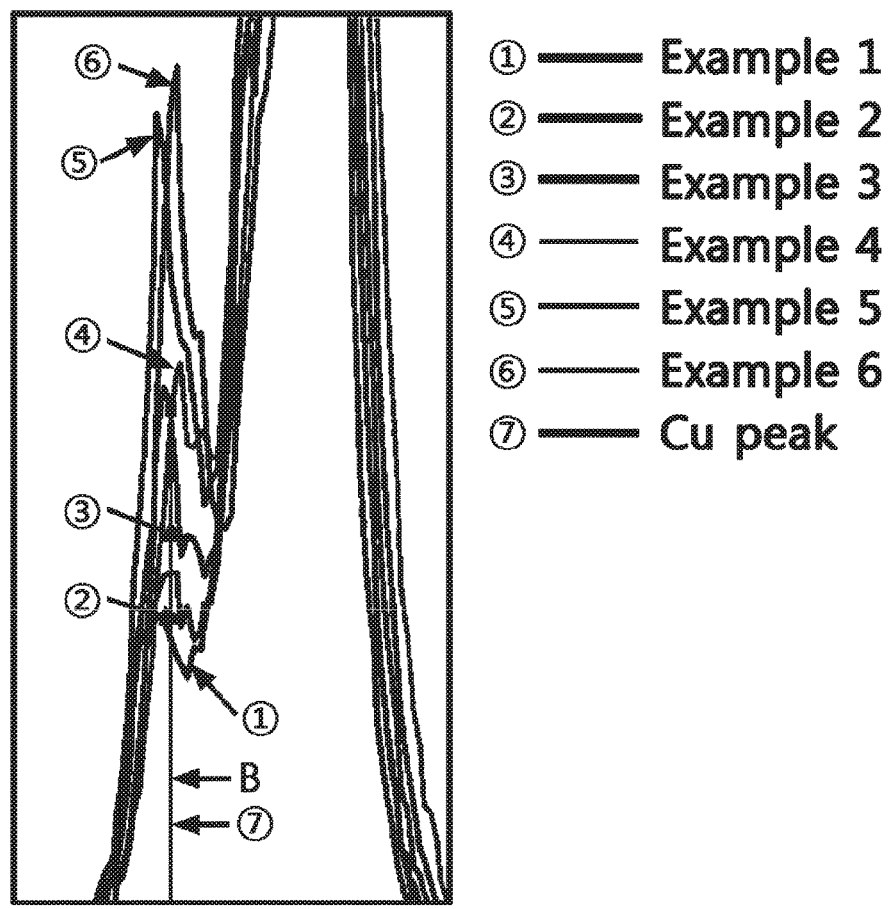
FIG. 3 is a graph showing a portion A of FIG. 2 in an enlarged state.

For the thermoelectric materials of Examples 1 to 6, XRD patterns were analyzed. The analysis results are depicted in FIG. 2. In addition, the portion A of FIG. 2 is shown in FIG. 3 in an enlarged state. In FIG. 3, a Cu peak which appears when Cu is present as a single component is marked with B.

Referring to FIGS. 1 and 2, it may be found that the samples of Examples 1 to 6 form a $Cu_2Se$ monoclinic main phase, and the Cu peak grows according to the tendency of excessive Cu. In addition, other second phase than the above was not observed.

Therefore, from the measurement results, it may be understood that all samples of Examples 1 to 6 were formed as $Cu_xSe_{1-y}S_y$, which is obtained by replacing some Se sites of $Cu_xSe$ with S, and were not form as $Cu_2S$.

Figure 4:
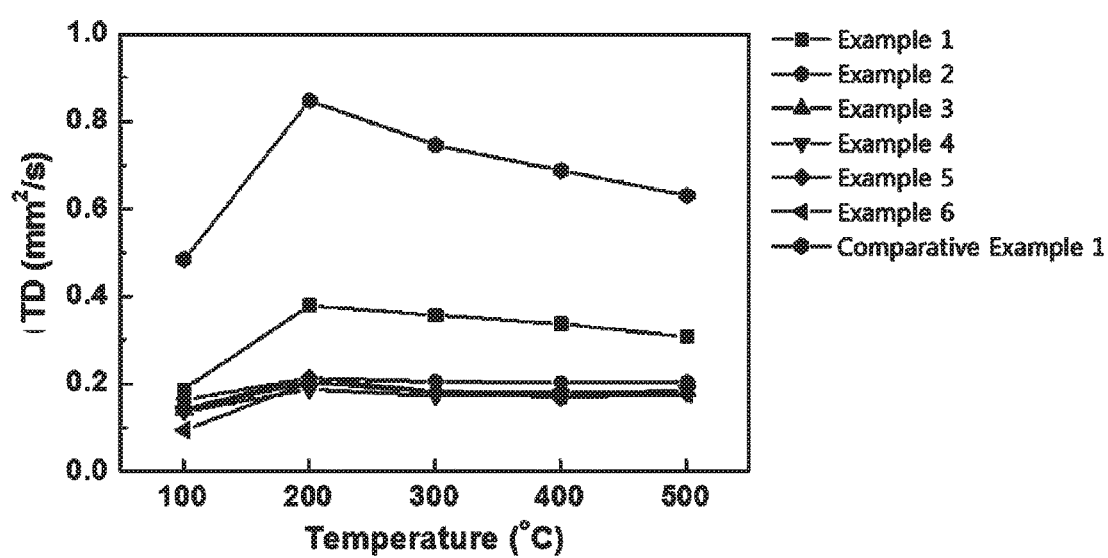
FIG. 4 is a graph comparatively showing thermal diffusivity measurement results of thermoelectric materials prepared according to examples of the present disclosure and a comparative example according to temperature.

In addition, for the samples of Examples 1 to 6 and the sample of the comparative example, thermal diffusivity (TD) was measured at predetermined temperature intervals by using LFA457 (Netzsch). The measurement results are depicted in FIG. 4 as Examples 1 to 6 and the comparative example.

Figure 5:
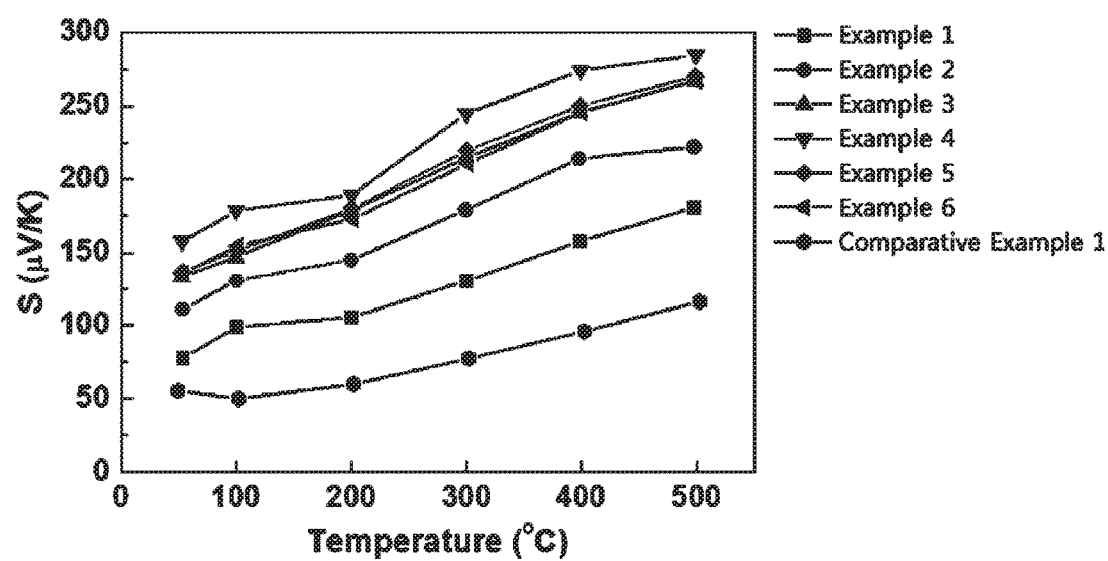
FIG. 5 is a graph comparatively showing Seebeck coefficient measurement results of thermoelectric materials prepared according to examples of the present disclosure and a comparative example according to temperature.

Moreover, for the samples of Examples 1 to 6 and the sample of the comparative example, electrical conductivity and Seebeck coefficient were measured at predetermined temperature intervals by using ZEM-3 (Ulvac-Riko, Inc.). Among them, the measurement results of Seebeck coefficient (S) are depicted in FIG. 5 as Examples 1 to 6 and the comparative example.

Figure 6:
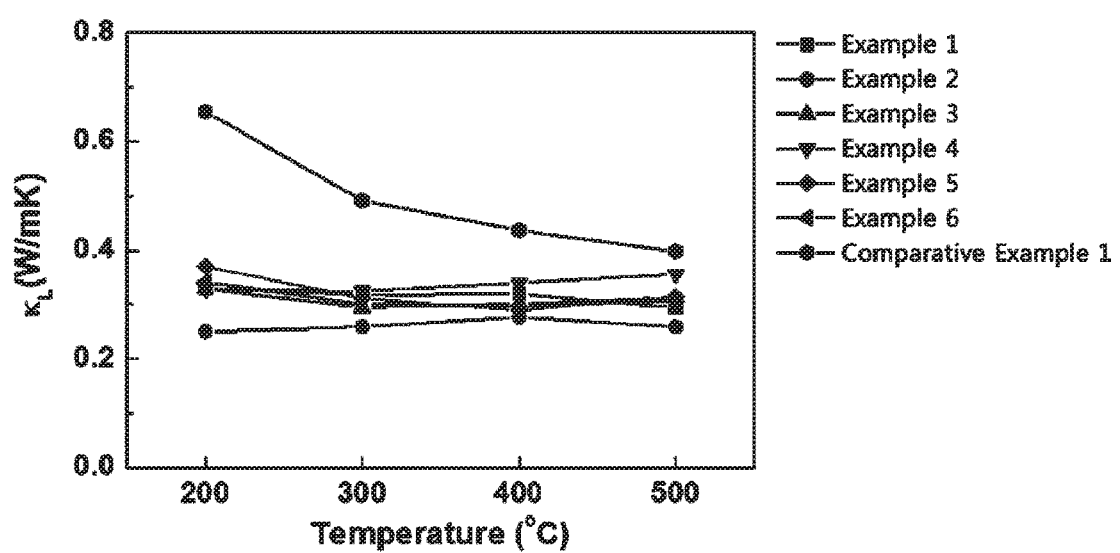
FIG. 6 is a graph comparatively showing lattice thermal conductivity measurement results of thermoelectric materials prepared according to examples of the present disclosure and a comparative example according to temperature.
Figure 7:
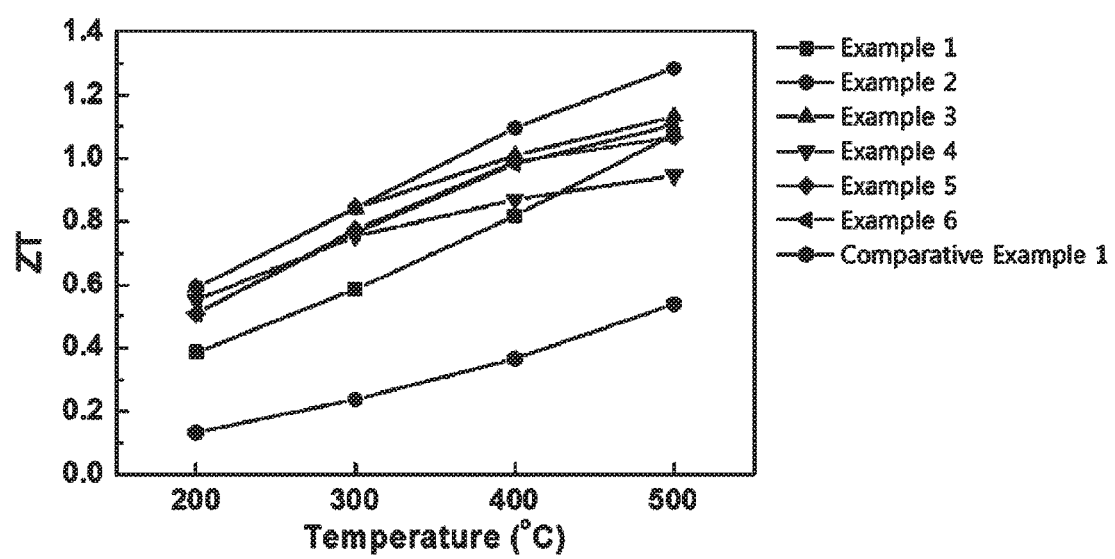
FIG. 7 is a graph comparatively showing ZT value measurement results of thermoelectric materials prepared according to examples of the present disclosure and a comparative example according to temperature.

In addition, for the samples of Examples 1 to 6 and the sample of the comparative example, lattice thermal conductivity ($\kappa_L$) and ZT values according to temperature were calculated. The calculation results are depicted in FIGS. 6 and 7. In particular, the lattice thermal conductivity was obtained by using the Wiedemann-Franz law, and Lorenz constant used at this time was $1.86*10^{-8}$. In more detail, the lattice thermal conductivity may be calculated using the following equation.

$$\kappa_L = \kappa_{total} - \kappa_e$$

Here, $\kappa_L$ represents lattice thermal conductivity, $\kappa_{total}$ represents thermal conductivity, and $\kappa_e$ represents thermal conductivity according to electric conductivity. In addition, $\kappa_e$ may be expressed as follows.

$$\kappa_e = \sigma LT$$

Here, Y means electric conductivity, and L is a Lorenz constant and represents 1.86 E-8. In addition, T means temperature (K).

First, referring to the results of FIG. 4, it may be found that the thermoelectric materials of Examples 1 to 6 expressed by $Cu_xSe_{1-y}S_y$ ($2<x\le2.6$, $0<y<1$) have greatly low thermal diffusivity over the entire temperature range of 100° C. to 500° C., in comparison to the thermoelectric material of the comparative example.

In more detail, the thermoelectric material of the comparative example has thermal diffusivity greater than 0.4 $mm^2/s$, but the thermoelectric materials of the Examples have thermal diffusivity not greater than 0.4 $mm^2/s$. Further, the thermoelectric material of the comparative example exhibit at least double thermal diffusivity in comparison to the thermoelectric materials of Examples 1 to 6. In particular, the thermoelectric materials of Examples 2 to 6 have thermal diffusivity of 0.2 $mm^2/s$ or below in the temperature range of 100° C. to 500° C., which means that the thermal diffusivity was greatly lowered to a level of about one-third or one-fourth in comparison to the comparative example.

Next, referring to the results of FIG. 5, it may be found that the thermoelectric materials of Examples 1 to 6 according to the present disclosure have greatly high Seebeck coefficient (S) over the entire temperature range of 50° C. to 500° C., in comparison to the thermoelectric material of the comparative example.

Representatively, the thermoelectric material of the comparative example has a Seebeck coefficient of just 120 μV/K or below at temperature of 500° C. or below, but the thermoelectric materials of Examples 1 to 6 exhibit Seebeck coefficients of 175 μV/K or above at temperature of 500° C. In particular, in Examples 2 to 6, the Seebeck coefficient were 220 μV/K or above at 500° C., and further, in Examples 3 to 6, the Seebeck coefficients were 260 μV/K or above.

In addition, referring to the results of FIG. 6, the thermoelectric material of the comparative example has lattice thermal conductivity higher than 0.4 W/mK in the temperature range of 200° C. to 500° C., but the thermoelectric materials of Examples 1 to 6 show lattice thermal conductivity lower than 0.4 W/mK in the same temperature range.

In particular, the thermoelectric material of the comparative example shows lattice thermal conductivity of about 0.65 W/mK at 200° C., but the thermoelectric materials of Examples 1 to 6 show lattice thermal conductivity of 0.4 W/mK, which is greatly different from the above. Further, the thermoelectric material of Example 2 shows lattice thermal conductivity of about 0.25 W/mK at 200° C., which is very lower than the lattice thermal conductivity of the comparative example.

Next, referring to the results of FIG. 7, it may be found that in the thermoelectric materials of the Examples, the ZT value was improved about three to four times in the temperature range of 200° C. to 500° C., in comparison to the thermoelectric material of the comparative example.

For example, at 200° C., the comparative example has a ZT value of just about 0.15, but the ZT values of Examples 1 to 6 are 0.35 or above. In particular, the ZT values of Examples 2 to 6 are 0.5 or above. Further, in Examples 2 and 3, the ZT values are about 0.6, which is about four times in comparison to the comparative example.

In addition, at 300° C., the ZT value of the comparative example is about 0.25 or below, but the ZT values of Examples 1 to 6 are greater than 0.5. In particular, the ZT values of Examples 2 to 6 are 0.7 or above. Further, in Examples 2 and 3, the ZT values are greater than 0.8, greatly different from the comparative example.

In addition, at 400° C., the ZT value of the comparative example is about 0.35 or below, but the ZT values of Examples 1 to 6 are 0.8 or above, further 1.0 or above, which is at least double. Further, in Example 2, the ZT value is about 1.1, greatly different from the comparative example.

In addition, at 500° C., the ZT value of the comparative example is about 0.5, but the ZT values of Examples 1 to 6 are 0.9 or above, further 1.0 or above. In particular, in Example 2, the ZT value is 1.25 or above.

From the above, it may be understood that the thermoelectric material according to each embodiment of the present disclosure has greatly lower thermal diffusivity, a higher Seebeck coefficient and a greatly improved ZT value or the like through the entire temperature range of 100° C. to 500° C., compared with the thermoelectric material of the comparative example. Therefore, the thermoelectric material of the present disclosure may be regarded as having excellent thermoelectric conversion performance.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. A thermoelectric material, expressed by Chemical Formula 1 below:

$$Cu_xSe_{1-y}Q_y \qquad \text{<Chemical Formula 1>}$$

where Q is  2<x≤2.6, and 0<y<0.1.

2. The thermoelectric material according to claim 1, wherein in Chemical Formula 1, x satisfies a condition of x≤2.2.

3. The thermoelectric material according to claim 1, wherein in Chemical Formula 1, x satisfies a condition of x≤2.1.

4. The thermoelectric material according to claim 1, wherein in Chemical Formula 1, x satisfies a condition of 2.025≤x.

5. The thermoelectric material according to claim 1, wherein in Chemical Formula 1, y satisfies a condition of y≤0.05.

6. A method for manufacturing a thermoelectric material, the method comprising:
   forming a mixture by weighing and mixing Cu, Se and Q according to Chemical Formula 1 defined in the claim 1; and
   thermally treating the mixture to synthesize a compound expressed by Chemical Formula 1.

7. The method for manufacturing a thermoelectric material according to claim 6, further comprising:
   sintering the compound under pressure after the compound forming step is performed.

8. The method for manufacturing a thermoelectric material according to claim 7,
   wherein the pressure sintering step is performed by means of hot pressing or spark plasma sintering.

9. A thermoelectric conversion element, comprising a thermoelectric material defined in claim 1.

10. A thermoelectric power generator, comprising a thermoelectric material according to claim 1.

* * * * *